United States Patent
Kang

(10) Patent No.: US 9,946,105 B2
(45) Date of Patent: Apr. 17, 2018

(54) OPPOSED SUBSTRATE, METHOD FOR FABRICATING THE SAME AND DISPLAY DEVICE

(71) Applicants: BOE Technology Group Co., Ltd., Beijing (CN); Hefei BOE Optoelectronics Technology Co., Ltd., Anhui (CN)

(72) Inventor: Sanghun Kang, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/166,371

(22) Filed: May 27, 2016

(65) Prior Publication Data

US 2016/0357056 A1    Dec. 8, 2016

(30) Foreign Application Priority Data

Jun. 3, 2015   (CN) .......................... 2015 1 0306142

(51) Int. Cl.
*G02F 1/1339*    (2006.01)
*G02F 1/1333*    (2006.01)
*H01L 27/12*    (2006.01)

(52) U.S. Cl.
CPC .... *G02F 1/133345* (2013.01); *H01L 27/1214* (2013.01); *H01L 27/1259* (2013.01); *G02F 1/133351* (2013.01); *G02F 2001/133388* (2013.01)

(58) Field of Classification Search
CPC ...... H01L 27/1214–27/1296; G02F 1/133351; G02F 1/1339–1/13394; G02F 2001/13396
See application file for complete search history.

(56) References Cited

U.S. PATENT DOCUMENTS

| 6,459,466 B1 * | 10/2002 | Fujikawa | G02F 1/1362 349/139 |
| 6,480,255 B2 * | 11/2002 | Hoshino | G02F 1/133753 349/139 |
| 8,253,139 B2 * | 8/2012 | Kao | H01L 27/1214 257/59 |

(Continued)

FOREIGN PATENT DOCUMENTS

| CN | 101441348 A | 5/2009 |
| CN | 101989018 A | 3/2011 |

(Continued)

OTHER PUBLICATIONS

Jul. 27, 2017—(CN) First Office Action Appn 201510306142.5 with English Tran.

*Primary Examiner* — Eric Ward
(74) *Attorney, Agent, or Firm* — Banner & Witcoff, Ltd.

(57) ABSTRACT

An array substrate and a method for fabricating the same and a display device are disclosed. The array substrate includes a protection layer, wherein the protection layer overlays a display region and a non-display region of the array substrate. The non-display region includes a cutting region, and a thickness of a part of the protection layer overlaying the cutting region is larger than that of a part of the protection layer overlaying the display region.

14 Claims, 3 Drawing Sheets

(56) References Cited

U.S. PATENT DOCUMENTS

| | | | |
|---|---|---|---|
| 8,748,891 B2* | 6/2014 | Takamatsu | G02F 1/1345 257/59 |
| 2010/0002182 A1* | 1/2010 | Lee | G02F 1/1339 349/154 |
| 2011/0031512 A1 | 2/2011 | Kao et al. | |
| 2013/0249877 A1* | 9/2013 | Choi | G09G 3/20 345/205 |
| 2016/0054611 A1 | 2/2016 | Zhao et al. | |

FOREIGN PATENT DOCUMENTS

| | | |
|---|---|---|
| CN | 202600314 U | 12/2012 |
| CN | 202886795 U | 4/2013 |
| CN | 104460118 A | 3/2015 |

\* cited by examiner

OPPOSED SUBSTRATE, METHOD FOR FABRICATING THE SAME AND DISPLAY DEVICE

This application claims priority to and the benefit of Chinese Patent Application No. 201510306142.5 filed on Jun. 3, 2015, which application is incorporated herein in its entirety.

FIELD OF THE ART

Embodiments of the invention relate to the technical area of display technologies, more particularly, to an opposed substrate, a method for fabricating the same and a display device.

BACKGROUND

Liquid crystal displays (LCD) have been widely used in the technical area of display technologies. A LCD comprises an array substrate and a color filter substrate which are cell-assembled and liquid crystals disposed between the array substrate and color filter substrate.

For the convenience of fabrication, one of the substrates needs to be cut. During a conventional cutting process, normally a hard material such as a diamond is used to impact the substrate to cause a breakage of the surface of the substrate, thereby cutting the substrate at the breakage. However, the removed parts often drop on the opposed substrate, thereby reducing the performance of the product.

SUMMARY

A first aspect of the invention provides an opposed substrate. The opposed substrate comprises: a protection layer overlaying a display region and a non-display region of the opposed substrate, wherein the non-display region comprises a cutting region and a thickness of a part of the protection layer overlaying the cutting region is larger than that of a part of the protection layer overlaying the display region.

Another aspect of the invention provides a display device comprising the above opposed substrate.

Still another aspect of the invention provides a method for fabricating an opposed substrate. The method comprises: providing an opposed substrate comprising a display region and a non-display region, wherein the non-display region comprises a cutting region; forming a protection layer on the opposed substrate, wherein the protection layer overlays the display region and the non-display region, and a thickness of a part of the protection layer overlaying the cutting region is larger than that of a part of the protection layer overlaying the display region.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

In the description, it can be understood that orientation or location relationships indicated by terms "up", "down", "inside", and "outside" are relationships with reference to the drawings only and used for describing the invention conveniently, instead of limiting a device or a component to a specific orientation or constructing or operating the device or component from a specific orientation. Therefore, such orientation or location relationships are not limitative to the invention.

Figure 1:
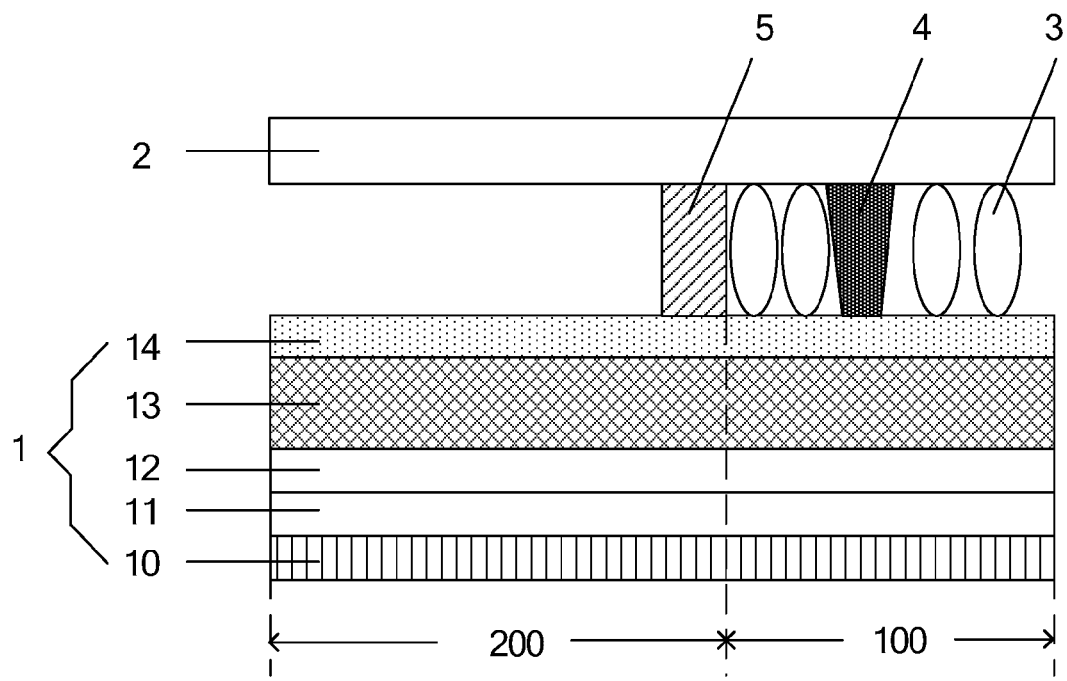
FIG. 1 schematically illustrates a diagram of a display device.

With reference to FIG. 1, a LCD comprises: an array substrate 1 and a color filter substrate 2 which are cell-assembled, liquid crystals 3 disposed between the array substrate 1 and the color filter substrate 2, a post spacer 4 and a sealant 5. The array substrate 1 comprises a display region 100 corresponding to a region within the sealant 5 and a non-display region 200 corresponding to a region outside the sealant 5. The non-display region comprises a base 10, on which a gate metal layer 11, a gate insulation layer 12, a source/drain metal layer 13 and a protection layer 14 are sequentially formed. As an example, a driving circuit is also disposed in the non-display region 200 of the array substrate 1 to drive the display region to display.

Figure 2:
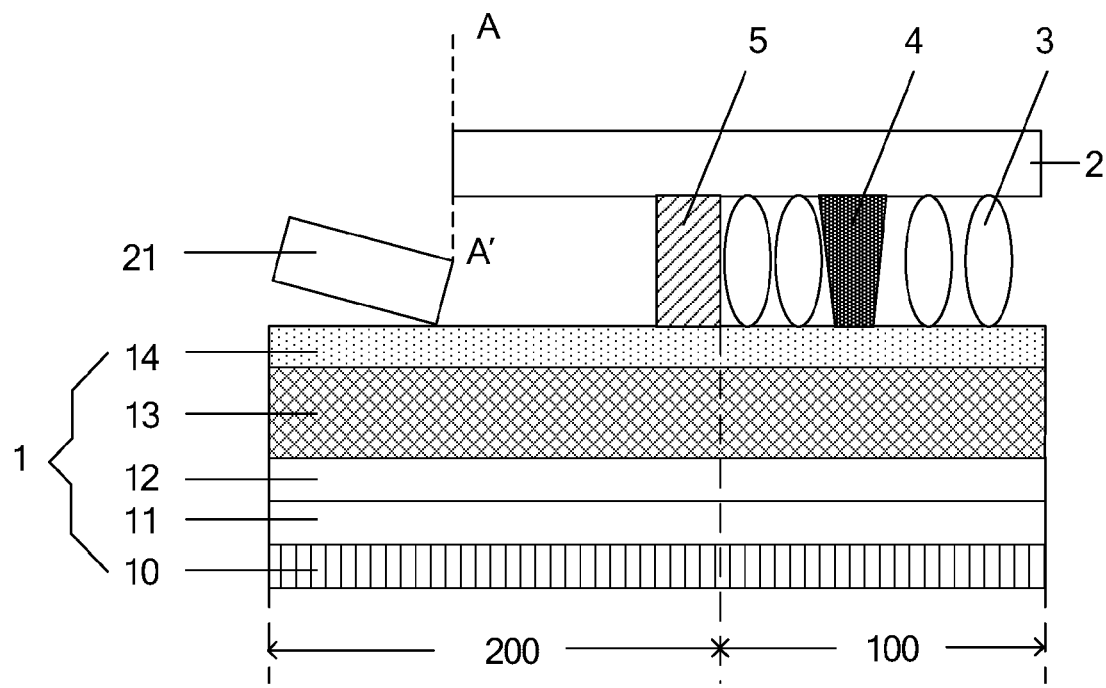
FIG. 2 schematically illustrates a diagram of a color filter substrate of FIG. 1 after being cut along AA' direction.

The color filter substrate needs to be cut before the driving circuit is disposed. With reference to FIG. 2, a cutting process is applied at the position of the color filter substrate 2 corresponding to the non-display region 200 of the array substrate along AA' direction. After the cutting process is finished, a removed part 21 of the color filter substrate 2 drops on the array substrate 1, causing the protection layer 14 of the array substrate 1 to be impacted and damaged, which further affects regions below the protection layer 14, such as causing a damage or a break of the source/drain metal layer 13, thereby compromising the performance of the product.

The following embodiment of the invention will be described by taking an array substrate as an example. However, the concept of the disclosure can be applied to other opposed substrate such as a color filter substrate.

Figure 3:
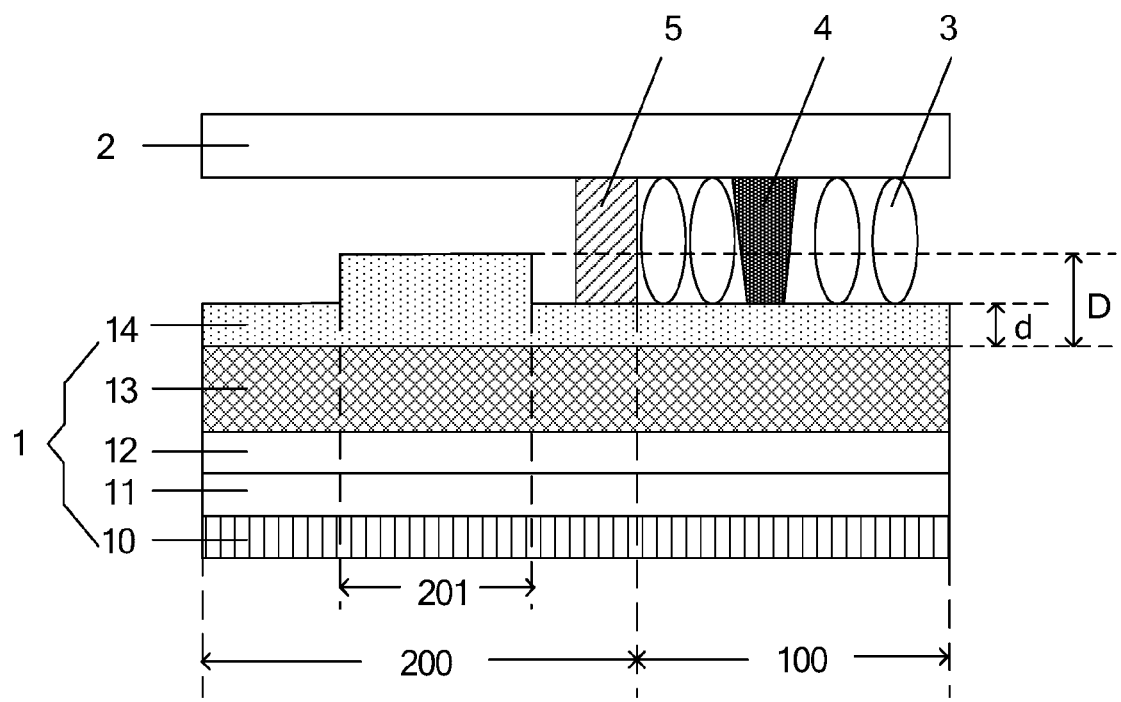
FIG. 3 schematically illustrates a diagram of a display device in accordance with an embodiment of the invention.

An embodiment of the invention provides an array substrate. With reference to FIG. 3, the array substrate 1 comprises: a protection layer 14, wherein the protection layer 14 overlays a display region 100 and a non-display region 200 of the array substrate 1. The non-display region 200 comprises a cutting region 201, and a thickness of a part of the protection layer 14 overlaying the cutting region 201 is larger than that of a part of the protection layer 14 overlaying the display region 100.

With reference to FIG. 3, the array substrate 1 of the embodiment and a color filter substrate 2 are cell-assembled through a sealant 5, the display region 100 of the array substrate 1 corresponds to a region having liquid crystals 3 disposed therein within the sealant 5, and the non-display region 200 is a region other than the display region 100. The cutting region 201 is a region corresponding to a cutting position of the color filter substrate 2.

In the above array substrate, layer structures formed in the display region and the non-display region are not defined in the embodiment of the invention. Exemplarily, the display region may have a gate electrode, a gate insulation layer, an active layer, a source electrode, a drain electrode, a pixel electrode and the like formed therein, or may have other layer structure; the non-display region may have a gate electrode driving circuit or other driving circuit, which will not be defined herein. The embodiment of the invention and the drawings are described with reference to an example of a non-display region and a display region, both of which has a base, a gate metal layer, a gate insulation layer, a source/drain metal layer and a protection layer.

In the above array substrate, a thickness of the part of the protection layer overlaying the cutting region is larger than that of the part of the protection layer overlaying the display region. Herein the thickness is a thickness of the protection layer along a direction orthogonal to the array substrate. With reference to FIG. 3, a thickness D of the part of the protection layer 14 overlaying the cutting region 201 is larger than a thickness d of the part of the protection layer 14 overlaying the display region 100.

It is noted that, the protection layer is generally an insulation layer overlaying a conductive layer which is the top most layer of the array substrate, while the conductive layer which is the top most layer of the array substrate is the electrically-conductive layer farthest away from the base. There may be no other layer structures on the protection layer of the array substrate; alternatively, an alignment layer is further disposed on the protection layer of the array substrate and the alignment layer is usually relatively thin.

Figure 4:
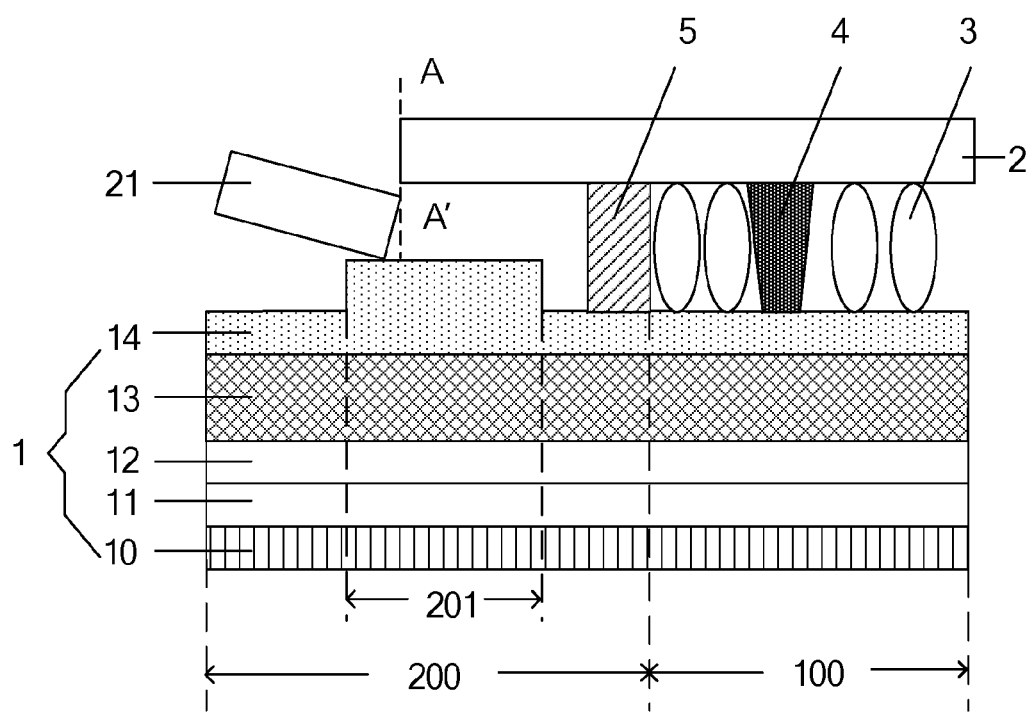
FIG. 4 schematically illustrates a diagram of a color filter substrate of FIG. 3 after being cut along AA' direction.

The embodiment of the invention provides an array substrate, wherein the thickness of the part of the protection layer overlaying the cutting region is larger than that of the part of the protection layer overlaying the display region. In this case, when the color filter substrate of the display device comprising the array substrate is being cut, with reference to FIG. 4 and FIG. 6, the thickness of the part of the protection 14 overlaying the cutting region 201 of the array substrate 1 is increased, thereby increasing the impact resistance of the protection layer 14. When the color filter substrate 2 is being cut along AA' direction, the damage from the removed part 21 of the color filter substrate 2 to the part of the protection layer 14 overlaying the cutting region 201 of the array substrate 1 is reduced, thereby reducing the influence to the regions below the protection layer 14 of the array substrate when the color filter substrate 2 is being cut.

Figure 5:
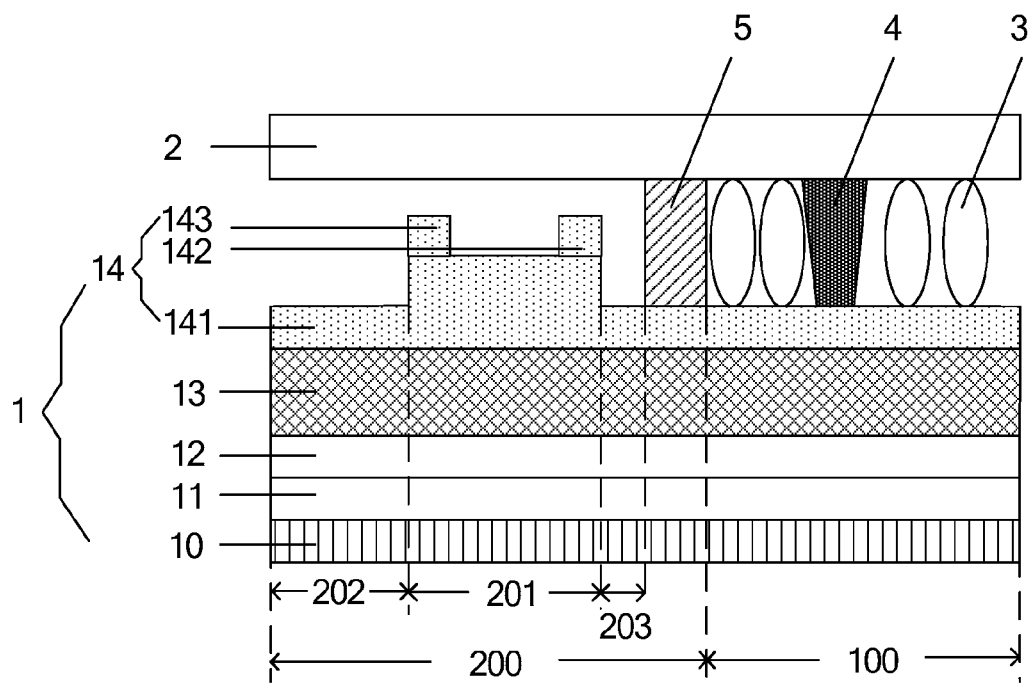
FIG. 5 schematically illustrates a diagram of another display device in accordance with an embodiment of the invention.

In at least some of the embodiments of the invention, with reference to FIG. 5, the protection layer 14 comprises: a protection layer body 141, and a thickness of a part of the protection layer body 141 overlaying the cutting region 201 is larger than that of a part of the protection layer body 141 overlaying the display region 100; a first protrusion 142, wherein the first protrusion 142 is disposed on the protection layer body 141 and at a first edge of the cutting region 201, and the first edge is close to the display region 100.

It is noted that, the shape and size of the first protrusion is not defined in the embodiment of the invention as long as the first protrusion has a function of blocking. For example, the first protrusion is strip-shaped. As fragments are generated during the color filter substrate is being cut, it is possible to prevent the fragments from entering the display region by having the first protrusion, thus preventing the damage to the protection layer of the display region from the fragments, thereby reducing the influence to the regions below the protection layer of the display region of the array substrate.

In at least some of the embodiments of the invention, with reference to FIG. 5, the non-display region 200 further comprises a peripheral region 202, wherein the peripheral region 202 is disposed on a side of the cutting region 201 away from the display region 100, and a thickness of a part of the protection layer body 141 overlaying the peripheral region 202 is the same as that of a part of the protection layer body 141 overlaying the display region 100. The protection layer 14 further comprises: a second protrusion 143, wherein the second protrusion 143 is disposed on the protection layer body 141 and at a second edge of the cutting region 201, and the second edge is away from the display region 100.

It is noted that, the layer structures in the peripheral region is not defined in the embodiment of the invention. Exemplarily, the peripheral region may comprise a gate electrode driving circuit or comprise other layer structure or circuit structure, and it is not defined herein. The embodiment of the invention and the drawings are described with reference to an example of a peripheral region having a base, a gate metal layer, a gate insulation layer, a source/drain metal layer and a protection layer.

It is further noted that, the thickness of the part of the protection layer body overlaying the peripheral region may be the same as that of the part of the protection layer body overlaying the display region, or may be the same as that of the part of the protection layer body overlaying the cutting region, which will not be defined herein. The embodiment of the invention and drawings are described with reference to an example where the thickness of the part of the protection layer body overlaying the peripheral region is the same as that of the part of the protection layer body overlaying the display region. Moreover, the shape and size of the second protrusion may be the same as or different from that of the first protrusion.

Figure 6:
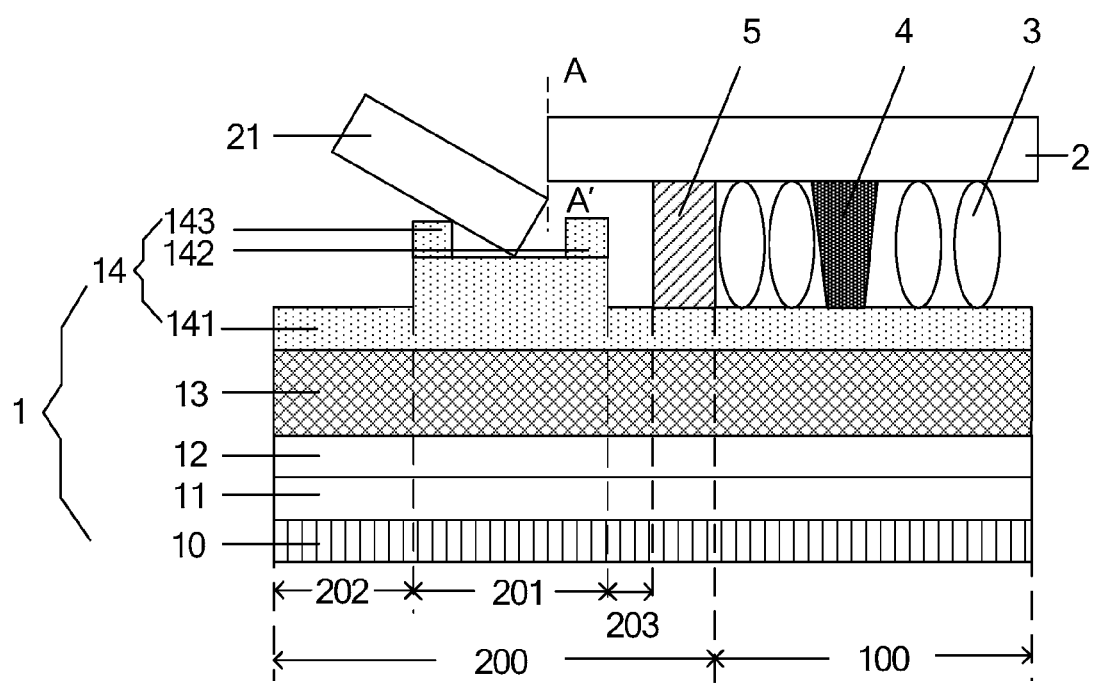
FIG. 6 schematically illustrates a diagram of a color filter substrate of FIG. 5 after being cut along AA' direction.

When the thickness of the part of the protection layer body overlaying the peripheral region is the same as that of the part of the protection layer body overlaying the display region, with reference to FIG. 6, it is possible to prevent the fragments generated when the color filter substrate 2 is being cut along AA' direction from entering the peripheral region 202 by having the second protrusion 143, thus preventing the damage from the fragments to the protection layer 14 disposed in the peripheral region 202, thereby reducing the influence to the regions below the protection layer of the peripheral region of the array substrate.

In at least some of the embodiments of the invention, the protection layer body, the first protrusion and the second protrusion may be an integral structure. As an example, the protection layer body, the first protrusion and the second protrusion may be formed through a single patterning process.

In at least some of the embodiments of the invention, in order to further prevent the fragments generated during the cutting process to the color filter substrate from entering other regions and better protect other regions, the shape of cross sections of the first protrusion and the second protrusion may be rectangle, trapezoid or triangle and the embodiment of the invention and the drawings are all described with reference to an example where the shape of cross sections of the first protrusion and the second protrusion is rectangle. Furthermore, a range of thicknesses of the first protrusion and the second protrusion may be from 20 μm to 50 μm, thus better preventing the fragments generated during the cutting process to the color filter substrate from entering other regions. Exemplarily, the thicknesses of the first protrusion and the second protrusion are 30 μm or 40 μm.

In at least some of the embodiments of the invention, the cost will be increased if the thickness of the part of the protection layer body overlaying the cutting region is too thick, and the impact resistance will be too low if the thickness is too thin. To balance the cost and the impact resistance, a range of the thickness difference between the part of the protection layer body overlaying the cutting region and the part of the protection layer body overlaying the display region is from 1000 Å to 1500 Å. Exemplarily, the thickness difference between the part of the protection layer body overlaying the cutting region and the part of the protection layer body overlaying the display region is 1100 Å, 1200 Å, 1300 Å or 1400 Å.

An embodiment of the invention provides a display device, with reference to FIG. 3 and FIG. 5, the display device comprises any of above array substrates. The display device may be a display component such as a liquid crystal display, or any products or components with a display function having the display component therein such as a television, a digital camera, a mobile phone, a tablet PC, etc.

In at least some of the embodiments of the invention, with reference to FIG. 5, the display device further comprises the color filter substrate 2 cell-assembled with the array substrate 1, the color filter substrate 2 and the array substrate 1 are assembled through a sealant 5. The non-display region 200 of the array substrate 1 further comprises an isolation region 203 disposed between the cutting region 201 and the sealant 5, and the thickness of the part of the protection layer 14 overlaying the isolation region 203 is the same as that of a part of the protection layer 14 overlaying the display region 100.

It is noted that, the thickness of the part of the protection layer overlaying the isolation region may be the same as that of the part of the protection layer overlaying the display region, or may be the same as the thickness of the part of the protection layer body overlaying the cutting region, which is not defined herein. The embodiment of the invention and the drawings are described with reference to an example where the thickness of the part of the protection layer overlaying the isolation region is the same as that of the part of the protection layer overlaying the display region.

It is further noted that, the display region of the array substrate provided by the embodiment of the invention is a region within the sealant, i.e., a region surrounded by the sealant, and the non-display region includes the sealant and a region outside the sealant.

Under the circumstances that the thickness of the part of the protection layer body overlaying the isolation region is the same as that of the part of the protection layer body overlaying the display region, there is a gap between the part of the protection layer body overlaying the cutting region and the sealant, thereby preventing the influence to the part of the protection layer body overlaying the cutting region during the sealant is being cured and preventing the interference between the part of the protection layer body overlaying the cutting region and the sealant.

An embodiment of the invention provides a method for fabricating an array substrate. The method comprises:

providing an array substrate which comprises a display region and a non-display region, wherein the non-display region comprises a cutting region; and forming a protection layer on the array substrate, wherein the protection layer overlays the display region and the non-display region of the array substrate, the non-display region comprises a cutting region and a thickness of a part of the protection layer overlaying the cutting region is larger than that of a part of the protection layer overlaying the display region.

As an example, the array substrate may be other opposed substrate such as a color filter substrate. A base substrate may be a corning gorilla glass, an asahi glass, a quartz glass and the like, and a thickness of the base substrate is from 50 μm to 1000 μm. The protection layer is made of an insulated material such as silicon oxide, silicon nitride, organic material, etc.

It is noted that, before the protection layer is formed on the base substrate, the method may further comprise: forming other layer structures or films on the base substrate such as a gate electrode, a gate insulation layer, an active layer, source electrode, drain electrode etc. After the protection layer is formed on the base substrate, the method may further comprise: forming other layer structures and films such as a pixel electrode, an alignment film and the like. The specific configuration can be depended on the actual situation and will not be defined herein.

An embodiment of the invention provides a method for fabricating an opposed substrate such as an array substrate. A thickness of a protection layer fabricated by the method disposed in a cutting region is larger than that of the protection layer overlaying a display region. Due to the above configuration, during a color filter substrate of a display device comprising the array substrate is being cut, the impact resistance of the protection layer overlaying the cutting region of the array substrate is increased due to the increased thickness of the protection layer, thus the damage from the removed part of the color filter substrate to the protection layer overlaying the cutting region of the array substrate is reduced significantly, thereby reducing the damage to the region below the protection layer of the array substrate during the color filter substrate is being cut.

In at least some of the embodiments of the invention, the protection layer comprises: a protection layer body, wherein a thickness of the protection layer body overlaying the cutting region is larger than that of the protection layer body overlaying the display region; a first protrusion, wherein the first protrusion is disposed on the protection layer body and at a first edge of the cutting region, and the first edge is close to the display region; a second protrusion, wherein the second protrusion is disposed on the protection layer body and at a second edge of the cutting region, and the second edge is away from the display region.

The step of forming the protection layer on the array substrate for example comprises: forming the protection layer body, the first protrusion and the second protrusion on the base through a single patterning process, thus reducing the cost. A patterning process is a process used to form a required layer structure by one exposure and generally comprises: applying a photoresist on a film, exposing the photoresist using a mask plate, removing the photoresist need to be removed using a developer, etching a part of the film which is not overlaid by the photoresist, and peeling the rest of the photoresist at last.

What is described above is related to the illustrative embodiments of the disclosure only and not limitative to the scope of the disclosure; the scopes of the disclosure are defined by the accompanying claims.

The present application claims priority from Chinese Application No. 201510306142.5, filed on Jun. 3, 2015, the disclosure of which is incorporated herein by reference in its entirety.

What is claimed is:

1. An opposed substrate, comprising: a protection layer overlaying a display region and a non-display region of the opposed substrate, wherein the non-display region comprises a cutting region, and a thickness of a part of the protection layer overlaying the cutting region is larger than that of a part of the protection layer overlaying the display region,
   wherein the protection layer is a single layer and comprises a protection layer body, a first protrusion, and a second protrusion, the protection layer body, the first protrusion, and the second protrusion are formed of the single layer,
   wherein the first protrusion is disposed on the protection layer body and at a first edge of the cutting region, and the first edge is close to the display region, and
   wherein the second protrusion is disposed on the protection layer body and at a second edge of the cutting region, and the second edge is away from the display region.

2. The opposed substrate of claim 1, wherein a thickness of a part of the protection layer body overlaying the cutting region is larger than that of a part of the protection layer body overlaying the display region.

3. The opposed substrate of claim 2, wherein a thickness difference between the part of the protection layer body overlaying the cutting region and the part of the protection layer body overlaying the display region is from 1000 Å to 1500 Å.

4. The opposed substrate of claim 1, wherein the non-display region further comprises a peripheral region, the peripheral region is disposed on a side of the cutting region away from the display region, and a thickness of a part of the protection layer body overlaying the peripheral region is the same as that of a part of the protection layer body overlaying the display region.

5. The opposed substrate of claim 1, wherein the protection layer body, the first protrusion and the second protrusion are of an integral structure.

6. The opposed substrate of claim 1, wherein a shape of a cross section of the first protrusion is a rectangle, a trapezoid or a triangle, and a shape of a cross section of the second protrusion is a rectangle, a trapezoid, or a triangle.

7. The opposed substrate of claim 1, wherein a thickness of the first protrusion is from 20 μm to 50 μm.

8. The opposed substrate of claim 1, wherein a thickness of the second protrusion is from 20 μm to 50 μm.

9. A display device comprising the opposed substrate of claim 1.

10. The display device of claim 9, wherein the opposed substrate is an array substrate.

11. The display device of claim 10, wherein the display device further comprises a color filter substrate, cell-assembled with the array substrate, the color filter substrate and the array substrate are cell-assembled through a sealant, a non-display region of the array substrate further comprises an isolation region disposed between the cutting region and the sealant, and a thickness of a part of the protection layer overlaying the isolation region is the same as that of a part of the protection layer overlaying the display region.

12. A method for fabricating an opposed substrate, comprising:
   providing an opposed substrate comprising a display region and a non-display region, wherein the non-display region comprises a cutting region; and
   forming a protection layer on the opposed substrate, wherein the protection layer overlays the display region and the non-display region, and a thickness of a part of the protection layer overlaying the cutting region is larger than that of a part of the protection layer overlaying the display region,
   wherein the protection layer is a single layer and comprises a protection layer body, a first protrusion, and a second protrusion, the protection layer body, the first protrusion, and the second protrusion are formed of the single layer,
   wherein the first protrusion is formed on the protection layer body and disposed at a first edge of the cutting region, and the first edge is close to the display region, and
   wherein the second protrusion is formed on the protection layer body and at a second edge of the cutting region, and the second edge is away from the display region.

13. The method of claim 12, wherein a thickness of the protection layer body overlaying the cutting region is larger than that of the protection layer body overlaying the display region.

14. The method of claim 12, wherein the step of forming a protection layer on the opposed substrate comprises:
   forming the protection layer body, the first protrusion, and the second protrusion on the opposed substrate through a single patterning process.

* * * * *